United States Patent
Kobayashi et al.

[11] Patent Number: 5,912,491
[45] Date of Patent: Jun. 15, 1999

[54] MOS DEVICE

[75] Inventors: Takashi Kobayashi; Takeyoshi Nishimura; Tatsuhiko Fujihira, all of Nagano, Japan

[73] Assignee: Fuji Electric Co., Ltd., Kanagawa, Japan

[21] Appl. No.: 08/746,987

[22] Filed: Nov. 19, 1996

[30] Foreign Application Priority Data

Nov. 21, 1995 [JP] Japan .................................. 7-302433

[51] Int. Cl.⁶ .................................................. H01L 29/76
[52] U.S. Cl. ........................................ 257/341; 257/653
[58] Field of Search .................................. 257/341, 653

[56] References Cited

U.S. PATENT DOCUMENTS

| | | | |
|---|---|---|---|
| 4,642,666 | 2/1987 | Lidow et al. | 357/23.4 |
| 4,959,699 | 9/1990 | Lidow et al. | 357/23.7 |
| 4,974,059 | 11/1990 | Kinzer | 357/23.4 |
| 5,008,720 | 4/1991 | Uenishi | 257/341 |
| 5,008,725 | 4/1991 | Lidow et al. | 357/23.4 |
| 5,034,796 | 7/1991 | Zommer | 257/341 |
| 5,043,779 | 8/1991 | Nishimura | 257/341 |
| 5,304,831 | 4/1994 | Yilmaz et al. | 257/341 |
| 5,521,410 | 5/1996 | Yamamoto | 257/341 |

Primary Examiner—Mark V. Prenty
Attorney, Agent, or Firm—Pearne, Gordon, McCoy & Granger LLP

[57] ABSTRACT

An $n^+$ drain layer 2 and an $n^-$ layer 1 on $n^+$ drain layer 2 constitute a substrate for the semiconductor arrangement. A p-type base region 3 is in the surface portion of $n^-$ layer 1. An $n^+$ source region 6 is formed in the surface portion of p-type base region 3. A $p^+$ region 5, deeper than $n^+$ source region 6 and shallower than p-type base region 3, partially overlaps $n^+$ source region 6 and extends thoroughly into the portion of p-type base region 3 surrounded by $n^+$ source region 6. A channel portion 7 is in the surface portion of p-type base region 3 extending between $n^-$ layer 1 and $n^+$ source regions 6. A gate electrode 8 is disposed above channel portion 7 with a gate insulation film 9 interposed therebetween. A source electrode 11 contacts with $p^+$ region 5 and $n^+$ source region 6. An inter-layer insulation film 10 on gate electrode 8 insulates source electrode 11 from gate electrode 8. A drain electrode 12 is on the surface of $n^+$ drain layer 2. A junction face 20 of p-type base region 3 and $n^-$ layer 1 has a finite radius of curvature such that the depth from the surface of $p^+$ region 5 to junction face 20 is deepest beneath the center of $p^+$ region 5.

1 Claim, 5 Drawing Sheets

MOS DEVICE

BACKGROUND OF THE INVENTION

1. Field of the Invention

The present invention relates to metal-oxide-semiconductor devices (hereinafter referred to as "MOS devices") such as a MOS field effect transistor (hereinafter referred to as a "MOSFET") and an insulated gate bipolar transistor (hereinafter referred to as an "IGBT").

2. Description of the Related Art

There have been known that a power MOSFET and power IGBT, which belong to the MOS device having a MOS structure on a semiconductor substrate, are controllable with a voltage.

FIG. 5 is a cross-sectional view showing a conventional MOSFET. Referring now to FIG. 5, an $n^+$ drain layer 2 and an $n^-$ layer 1 on $n^+$ drain layer 2 constitute a substrate for the semiconductor arrangement of FIG. 5. A p-type base region 17 is in the surface portion of $n^-$ layer 1. A $p^+$ region 21 is formed partially overlapping p-type base region 17 and more deeply than p-type base region 17. In the surface portion of p-type base region 17, an $n^+$ source region 6 is formed. A channel portion 7 is in the surface portion of p-type base region 17 extending between $n^-$ layer 1 and $n^+$ source regions 6. A gate electrode 8 is disposed above channel portion 7 with a gate insulation film 9 interposed therebetween. A source electrode 11 is in contact with $p^+$ region 21 and $n^+$ source region 6. An interlayer insulation film 10 on gate electrode 8 insulates source electrode 11 from gate electrode 8. A drain electrode 12 is on the surface of $n^+$ drain layer 2. A second $p^+$ region 22 may be formed as surrounded by a dotted curve to secure excellent contact of source electrode 11 and to reduce the influence of the parasitic transistor described later.

The MOSFET of FIG. 5 is manufactured as follows. A semiconductor substrate is prepared by forming a highly resistive $n^-$ layer 1 on an $n^+$ drain layer 2. A $p^+$ region 21 is formed by introducing atoms of the third group of elements such as boron (B) into $n^-$ layer 1 by ion implantation or by diffusion. A gate insulation film 9 is deposited on $n^-$ layer 1, and then polycrystalline silicon layer for gate electrode 8 on gate insulation film 9. A window is defined through gate electrode 8 by photolithography, and a p-type base region 17 is formed by diffusion through the window. An $n^+$ source region 6 is formed by implanting ions of the fifth group of elements such as arsenic (As) by utilizing again gate electrode 8 with the window defined therein as a part of a mask for the ion implantation. Then, the foregoing second $p^+$ region 22 is formed, if required. The entire surface of the semiconductor structure constructed so far including gate electrode 8 but excluding the portion for a contact hole is covered with an interlayer insulation film 10. Finally, a source electrode 11 is formed on $n^+$ source region 6, $p^+$ region 21 and interlayer insulation film 10.

By applying a voltage, positive with respect to source electrode 11, to gate electrode 8, a channel is created in channel portion 7 beneath gate insulation film 9. Electrons are injected through channel portion 7 from $n^+$ source region 6 to $n^-$ layer 1 to make the MOSFET conductive. By basing gate electrode 8 at a potential same as or negative with respect to the potential of source electrode 11, the MOSFET becomes nonconductive. To say in other words, the MOSFET of FIG. 5 exhibits a switching function.

FIG. 6 is a cross-sectional view showing a conventional IGBT. The IGBT of FIG. 6 is different from the MOSFET of FIG. 5 in that $n^+$ drain layer 2 of the MOSFET is replaced by a $p^+$ collector layer 14 in the IGBT, and that an $n^+$ buffer layer 15 is interposed between $p^+$ collector layer 14 and $n^-$ layer 1. The $p^+$ collector layer 14, $n^+$ buffer layer 15 grown in epitaxy onto $p^+$ collector layer 14 and $n^-$ layer 1 grown in epitaxy onto $n^+$ buffer layer 15 constitute a semiconductor substrate for the semiconductor arrangement of FIG. 6. The regions of the IGBT are formed through the similar manufacturing steps as those of the MOSFET. In operating the IGBT, holes injected from $p^+$ collector layer 14 modulate the conductivity of $n^-$ layer 1 to lower the resistance of $n^-$ layer 1.

In manufacturing the foregoing MOSFET and IGBT, $n^+$ source region 6 and p-type base region 17 are usually formed by self-alignment using gate electrode 8 for masking. Alternatively, p-type base region 17 may be formed through a photoresist mask, and $n^+$ source region 6 through a poly-crystalline silicon mask. Still alternatively, $n^+$ source region 6 and p-type base region 17 may be formed through respective photoresist masks.

When the foregoing MOSFET and IGBT are used in an invertor connected to an inductive load, the devices are often broken down at turning off of the devices through the following mechanism.

FIG. 7 is a cross-sectional view showing a part of the conventional MOSFET and an equivalent circuit thereof. The MOSFET includes a parasitic transistor consisting of $n^+$ source region 6, p-type base region 17 and $n^-$ layer 1. When the MOSFET is turned off under the inductive load, channel portion 7 becomes nonconductive. In this state, no electrons are injected from $n^+$ source region 6 to $n^-$ layer 1, and a depletion layer expands into $n^-$ layer 1. Though the voltage applied between the source and drain of the MOSFET rises up to the breakdown voltage of the device, an avalanche current flows to consume the energy stored in the inductive load in the MOSFET. The avalanche current flows through p-type base region 17 beneath $n^+$ source region 6. If the voltage drop caused by the avalanche current across the lateral resistance of p-type base region 17 is large, the foregoing parasitic transistor turns on to break down the device. To obviate the above described drawbacks and to prevent the parasitic bipolar transistor 30 from turning on, the avalanche current is concentrated into $p^+$ region 21 and prevented from flowing into p-type base region 17 by setting its breakdown voltage lower than the breakdown voltage of p-type base region 17. If $p^+$ region 21 is diffused deeply to concentrate the avalanche current thereto, the portion of $n^-$ layer 1 between $p^+$ region 21 and $n^+$ drain layer 2 becomes thin. Though the thin $n^+$ drain layer 2 lowers its breakdown voltage, the path of the injected electrons between channel portion 7 and drain electrode 12 remains unchanged. Therefore, the on-resistance of the device remains unchanged. If $n^-$ layer 1 is thickened corresponding to the increased depth of $p^+$ region 21 to maintain the rated voltage of the device unchanged, the on resistance of the device increases. To maintain the on-resistance unchanged, the chip size should be widened.

SUMMARY OF THE INVENTION

In view of the foregoing, it is an object of the invention to obviate the foregoing problems of the prior art.

It is another object of the invention to provide a MOS device which causes neither lowering of its breakdown voltage nor increase of its on-resistance.

It is still another object of the invention to provide a MOS device with low manufacturing costs.

According to one aspect of the invention, there is provided a MOS device which includes a semiconductor layer of a first conductivity type, the semiconductor layer having a major surface; a base region of a second conductivity type formed from a portion of the major surface; the base region having a surface plane; the base region having a junction face with the semiconductor layer; a source region of the first conductivity type, the source region being selectively formed from the surface plane of the base region; an insulation film on a portion of the base region extending between the source region and the semiconductor layer; a gate electrode on said insulation film; and the junction face having a finite radius of curvature at least on one cross section of the semiconductor layer such that the junction face and the surface plane of the base region are spaced apart from each other most widely beneath the center of the surface plane.

According to another aspect of the invention, there is provided a MOS device which includes a semiconductor layer of a first conductivity type, the semiconductor layer having a major surface; a base region of a second conductivity type formed from a portion of the major surface; the base region having a surface plane; the base region having a junction face with the semiconductor layer; source regions of the first conductivity type, the source regions being selectively formed from the surface plane of the base region; insulation films on respective portions of the base region extending between said source regions and said semiconductor layer; gate electrodes on said insulation films; and said junction face having a finite radius of curvature at least on one cross section of said semiconductor layer such that said junction face and said surface plane of said base region are spaced apart from each other most widely beneath said surface plane's center.

Advantageously, the MOS device further includes a heavily doped region of the second conductivity type, the heavily doped region being in a part of the source region and in a portion of said base region surrounded by the source region.

Advantageously, the MOS device further includes a heavily doped region of said second conductivity type, said heavily doped region being in a part of said source regions and in a portion of said base region surrounded by said source regions.

Advantageously, the base region has a planar pattern shaped with a polygon, the corners thereof are preferably curved.

Advantageously, the base region has a planar pattern shaped with a stripe.

When the MOS device is a MOSFET, an avalanche current is concentrated in the avalanche portion located in the deepest portion of the p-type base region to suppress the current component flowing into the portion or portions of p-type base region beneath the n+ source region or source regions. Thus, the parasitic bipolar transistor is prevented from becoming conductive to prevent the MOSFET from being broken down when the MOSFET is turned off under the inductive load.

When the MOS device is an IGBT, a parasitic thyristor included in the IGBT is prevented from becoming conductive to prevent the IGBT from being broken down when the IGBT is turned off under the inductive load.

DETAILED DESCRIPTION OF THE PREFERRED EMBODIMENTS

Now, a description will be given in more detail of embodiments of the present invention with reference to the accompanying drawings.

Figure 1:
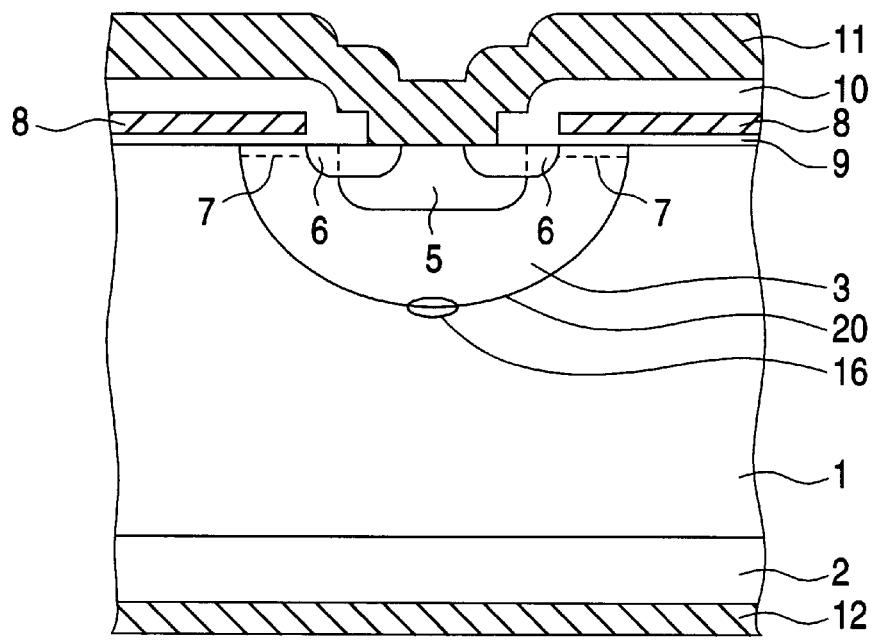
FIG. 1 is a cross-sectional view showing a MOSFET according to a first embodiment of the present invention.
Figure 5:
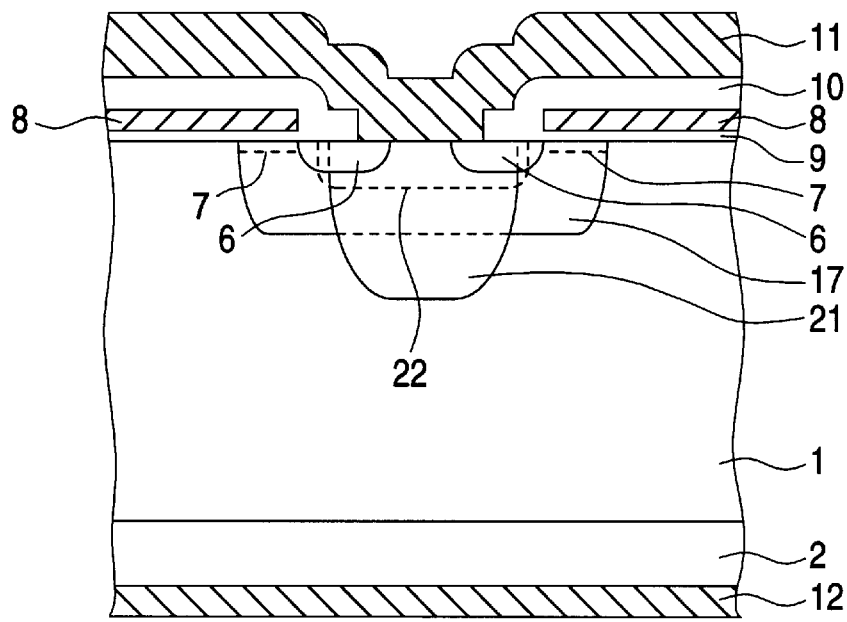
FIG. 5 is a cross-sectional view showing a conventional MOSFET.

FIG. 1 is a cross-sectional view showing a MOSFET according to a first embodiment of the present invention. In FIG. 1, like parts with those of FIG. 5 are designated by the like reference numerals. Referring now to FIG. 1, an $n^+$ drain layer 2 and an $n^-$ layer 1 on $n^+$ drain layer 2 constitute a substrate for the semiconductor arrangement of FIG. 1. A p-type base region 3 is in the surface portion of $n^-$ layer 1. An $n^+$ source region 6 is formed in the surface portion of p-type base region 3. A $p^+$ region 5, deeper than $n^+$ source region 6 and shallower than p-type base region 3, partially overlaps $n^+$ source region 6 and extends thoroughly into the portion of p-type base region 3 surrounded by $n^+$ source region 6. A channel portion 7 is in the surface portion of p-type base region 3 extending between $n^-$ layer 1 and $n^+$ source regions 6. A gate electrode 8 is disposed above channel portion 7 with a gate insulation film 9 interposed therebetween. A source electrode 11 contacts with $p^+$ region 5 and $n^+$ source region 6. An interlayer insulation film 10 on gate electrode 8 insulates source electrode 11 from gate electrode 8. A drain electrode 12 is on the surface of $n^+$ drain layer 2. A junction face 20 of p-type base region 3 and $n^-$ layer 1 has a finite radius of curvature. At the center of junction face 20, the depth from the surface of $p^+$ region 5 to junction face 20 is deepest. When the surface concentration of p-type base region is high enough for an ohmic contact, it is not necessary to form $p^+$ region 5. The p-type base region 3 has a channel portion 7 in which a channel is created, and an avalanche portion 16 which is located most deeply from which the surface of p-type base region 3. An avalanche starts from avalanche portion 16 when a reverse bias voltage is applied.

Figure 2:
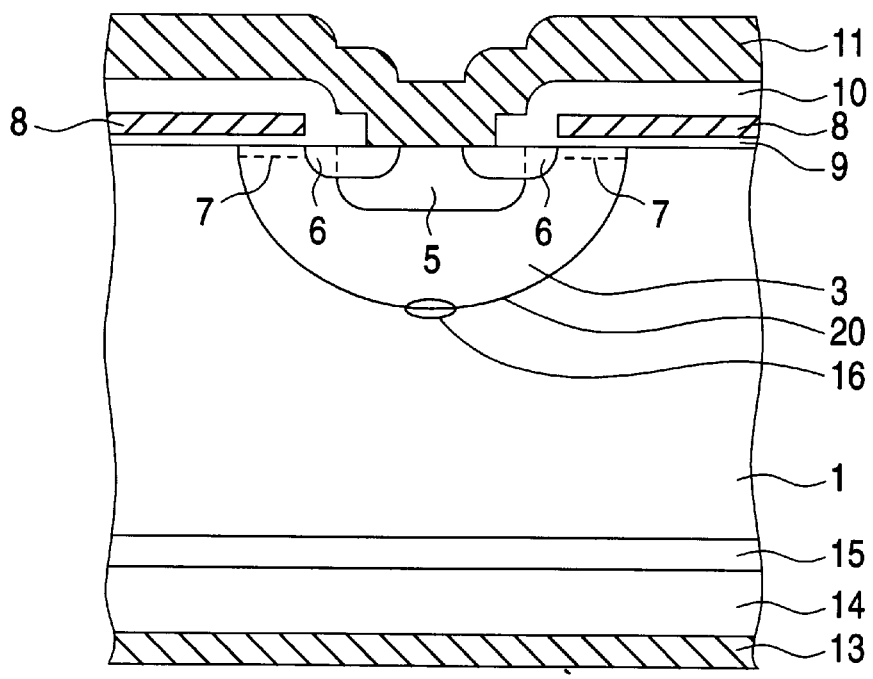
FIG. 2 is a cross-sectional view showing an IGBT according to a second embodiment of the present invention.
Figure 6:
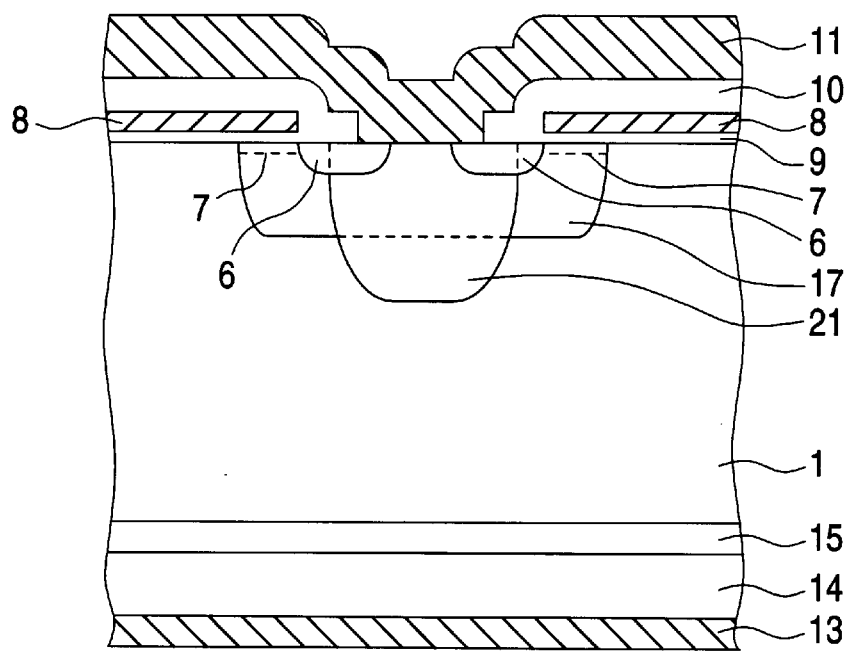
FIG. 6 is a cross-sectional view showing a conventional IGBT.
Figure 7:
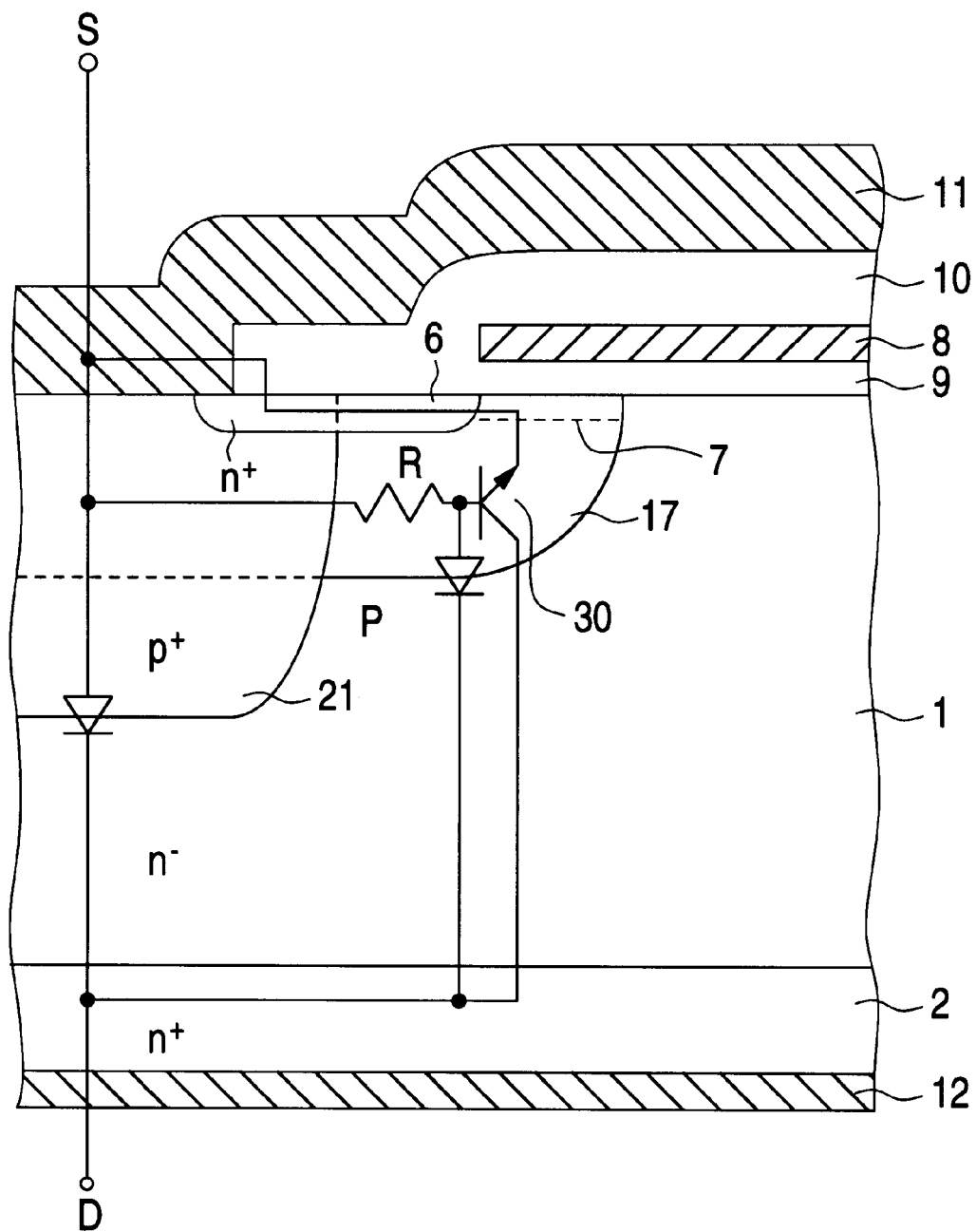
FIG. 7 is a cross-sectional view showing a part of the conventional MOSFET and an equivalent circuit thereof.

FIG. 2 is a cross-sectional view showing an IGBT according to a second embodiment of the present invention. In FIG. 2, like parts with those of FIG. 6 are designated by the like reference numerals. The IGBT of FIG. 2 is different from the MOSFET of FIG. 1 in that a collector electrode 13 is formed on a $p^+$ collector layer 14. The $p^+$ collector layer 14 is on an $n^+$ buffer layer 15 on a second surface of $n^-$ layer 1. The $n^+$ source region 6 in FIG. 1 is an $n^+$ emitter region 6 in FIG. 2, and source electrode 11 in FIG. 1 is an emitter electrode 11 in FIG. 2. In the same manner as in FIG. 1, a junction face 20 of p-type base region 3 and n⁻ layer 1 has a finite radius of curvature. At the center of junction face 20, the depth from the surface of p⁺ region 5 to junction face 20 is deepest.

Figure 3A:
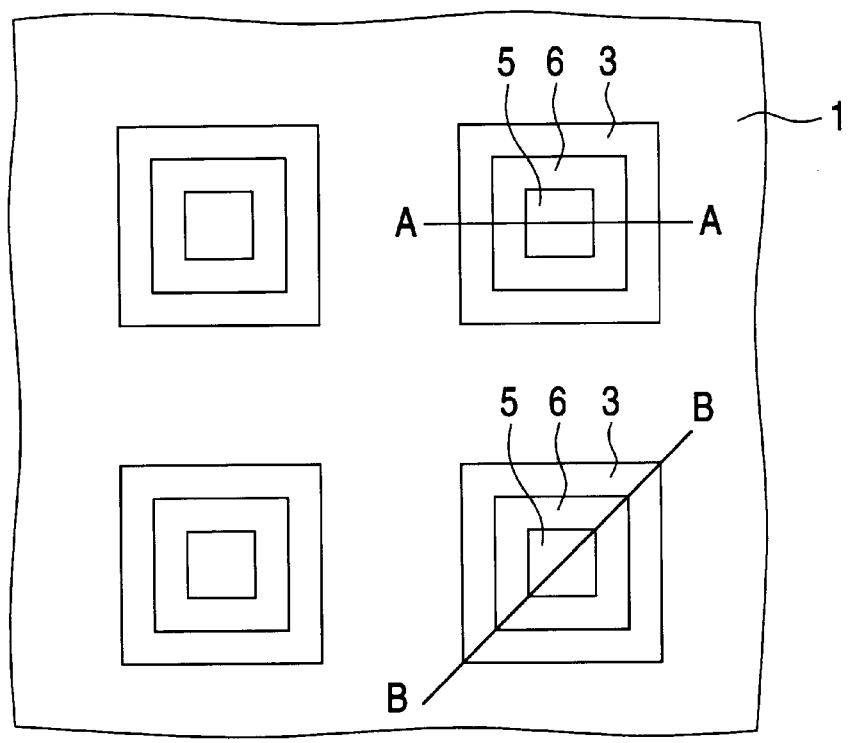
FIG. 3A is a plan view showing the MOS device of FIG. 1 or 2 having a square cell pattern.
Figure 3B:
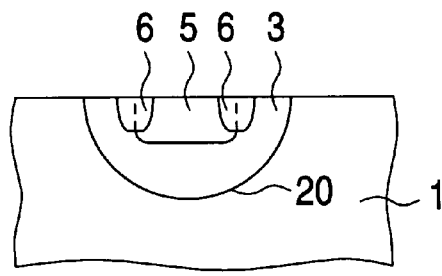
FIG. 3B is a cross-sectional view taken along a line A—A of FIG. 3A.
Figure 3C:
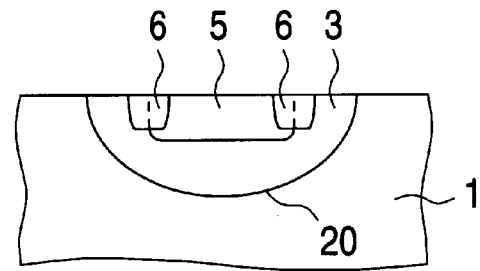
FIG. 3C is a cross-sectional view taken along a line B—B of FIG. 3A.

FIG. 3A is a plan view showing the MOS device of FIG. 1 or FIG. 2 having a square cell pattern. FIG. 3B is a cross-sectional view taken along a line A—A of FIG. 3A, and FIG. 3C is a cross-sectional view taken along a B—B of FIG. 3A. The window defined through the gate electrode as a mask for forming the p-type has a square cell pattern. The cell pattern may be triangle or circular. In either cross sections of FIG. 3B and FIG. 3C, a junction face 20 of p-type base region 3 and n⁻ layer 1 has a finite radius of curvature and the depth from the surface of p⁺ region 5 to junction face 20 is deepest at the center of junction face 20. Therefore, the thickness of n⁻ layer 1 is thinnest beneath the center of junction face 20. An avalanche starts from the thinnest part of n⁻ layer 1 when a reverse bias voltage is applied. When there exists no p⁺ region 5, junction face 20 is located most deeply at the center of the surface of n-type base region 3.

Figure 4A:
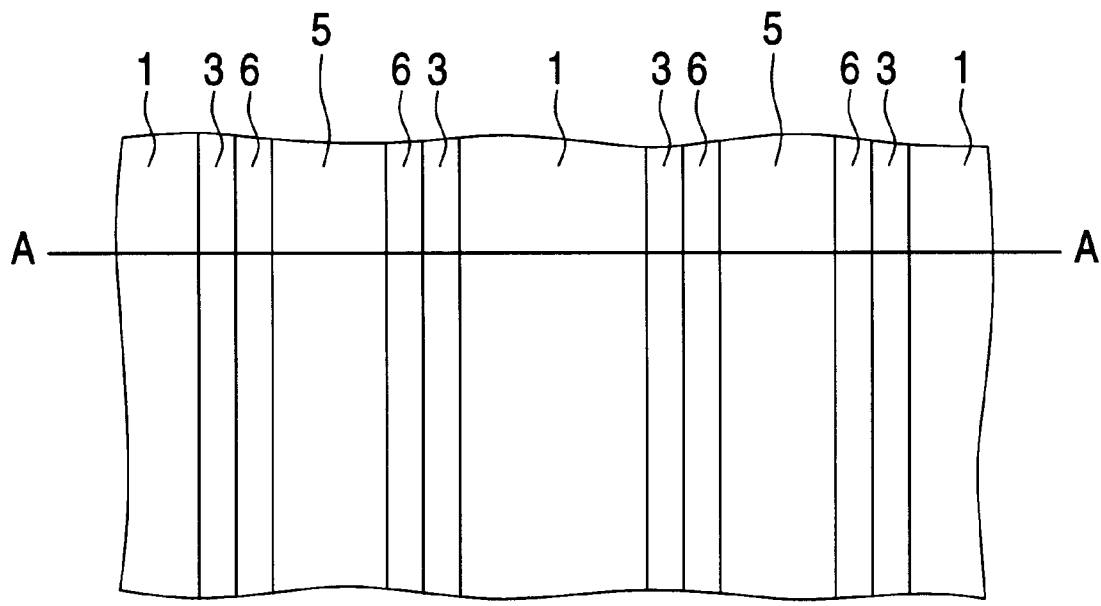
FIG. 4A is a plan view showing a MOSFET or IGBT which has a stripe cell pattern.
Figure 4B:
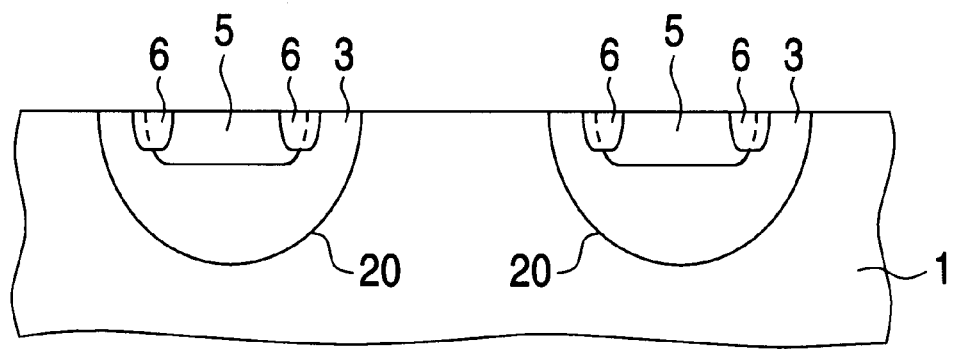
FIG. 4B is a cross-sectional view taken along a line A—A of FIG. 4A.

FIG. 4A is a plan view showing a MOSFET or IGBT which has a stripe cell pattern. FIG. 4B is a cross-sectional view taken along a line A—A of FIG. 4A. In these figures, each cell has two n⁺ source regions 6 formed in the surface portion of p-type base region 3. A p⁺ region 5, deeper than two n⁺ source regions 6 and shallower than p-type base region 3, partially overlaps two n⁺ source regions 6, 6 and extends thoroughly into the portion of p-type base region 3 sandwiched by two n⁺ source regions 6. In each cell, channels are created in the respective surface portions of p-type base region 3 extending between n⁻ layer 1 and n⁺ source regions 6. The p-type base region 3 and n⁺ source regions 6 are formed using the stripe gate electrodes for masking. In FIG. 4B, a junction face 20 of p-type base region 3 and n⁻ layer 1 has a finite radius of curvature and the depth from the surface of p⁺ region 5 to junction face 20 is deepest at the center of junction face 20, from which an avalanche starts when a reverse bias voltage is applied. When there exists no p⁺ region 5, junction face 20 is located most deeply at the center of the surface of n-type base region 3.

Now, a method of manufacturing the MOS devices of the present invention will be explained at first by way of the MOSFET of FIG. 1. An oxide film or such an insulation film is deposited on n⁻ layer 1 for forming gate insulation film 9. Poly-crystalline silicon layer is deposited on gate insulation film 9. Poly-crystalline silicon layer is then patterned, and gate electrode 8 is formed. In the case of a square cell, an opening of 8×8 μm is formed on gate electrode 8. Using the gate electrode 8 for masking, boron (B) ions are implanted through the opening. The p-type base region 3, which is 2 μm in depth and having the surface concentration of $10^{17}$ cm⁻³, is formed by thermally diffusing the implanted boron ions at 1150° C. for 200 min. Then n⁺ source region 6 is formed by implanting arsenic (As) ions using gate electrode 8 again for masking and by thermally treating the implanted arsenic ions. To improve the contact with source electrode 11 and to prevent the foregoing parasitic bipolar transistor from working, p⁺ region 5 is formed in the portion, which is in direct contact directly with source electrode 11, of p-type base region 3. The p⁺ region 5 is formed by heavily implanting boron ions using a photoresist mask and by thermally treating the implanted boron ions. Then, interlayer insulation film 10 is deposited and patterned. Then, source electrode 11 is deposited on interlayer insulation film 10.

For the IGBT of the invention, a semiconductor substrate consisting of p⁺ collector layer 14, an epitaxial n⁺ buffer layer 15 on p⁺ collector layer 14, and an epitaxial n⁻ layer 1 on n⁺ buffer layer 15 is used. The regions of the IGBT are formed on the substrate in the similar manner and through the similar steps as those of the IGBT. When the surface concentration of p-type base region is high enough for an ohmic contact, the process for forming p⁺ region 5 may be omitted.

To provide p-type base region with a finite radius of curvature, it is preferable to set the opening in the poly-crystalline silicon gate electrode at 20 μm or less, the diffusion depth from 1 to 10 μm. The opening is always set larger than the diffusion depth. The preferable surface concentration of p-type base region 3 is from $10^{16}$ to $6 \times 10^{17}$ cm⁻³. To provide p-type base region 3 with a finite radius of curvature, it is preferable to conduct the thermal diffusion of p-type base region 3 at more than 1100° C. for 200 min. or longer, since any finite radius of curvature has not been obtained by the thermal diffusion at 1100° C. for 200 min. However, since thermal diffusion at too high temperatures for too many hours elongates the channel length and increases the on-resistance, thermal diffusion should be conducted at 1200° C. or lower. It is preferable to finish the thermal diffusion at 1150° C. within 30 hr.

By providing the p-type base region with a finite radius of curvature such that the p-type base region is deepest at the center thereof, the parasitic bipolar transistor (or a parasitic thyristor) formed by the p-type base region and the n⁺ drain region is prevented from being conductive, and the inductive-load withstand capability (current-interruption withstand capability) can be improved without lowering the breakdown voltage of the device and without increasing the on-resistance of the device. The manufacturing method described herein facilitates lowering the manufacturing costs of the present MOS device.

What is claimed is:

1. A MOS device comprising:

a semiconductor layer of a first conductivity type, said semiconductor layer having a major surface;

a base region of a second conductivity type formed from a portion of said major surface, said base region having a planar pattern shaped with a stripe and including a surface plane and a junction face, said junction face adjoining the semiconductor layer;

source regions of said first conductivity type, said source regions being selectively formed from said surface plane of said base region;

insulation films on respective portions of said base region extending between said source regions and said semiconductor layer; and gate electrodes on said insulation films; and wherein said junction face, as viewed in a cross section of the semiconductor layer which is perpendicular to said major surface, forms a convex curve that extends downwardly from the insulation films and has a finite radius of curvature at each point on the curve.

* * * * *

UNITED STATES PATENT AND TRADEMARK OFFICE
CERTIFICATE OF CORRRECTION

PATENT NO. : 5,912,491
DATED : June 15, 1999
INVENTOR(S) : Takashi Kobayashi, et al.

It is certified that error appears in the above-identified patent and that said Letters Patent is hereby corrected as shown below:

On the title page, item [56] insert the following

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 4 | 8 | 0 | 1 | 9 | 8 | 6 | 1/1989 | Chang, et al | 357 | 23.4 | |
| | | 5 | 0 | 0 | 8 | 7 | 2 | 0 | 4/1991 | Uenishi | 357 | 23.4 | |
| | | 5 | 0 | 4 | 3 | 7 | 7 | 9 | 8/1991 | Nishimura | 357 | 23.4 | |
| | | | | | | | | | | | | | |

FOREIGN PATENT OR PUBLISHED FOREIGN PATENT APPLICATION

| | | DOCUMENT NUMBER | | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|---|
| | | 0 | 3 | 1 | 0 | 0 | 4 | 7 | 4/89 | Europe | | | | |
| | | 2 | 2 | 4 | 0 | 4 | 2 | 7 | 7/91 | Great Britain | | | | |
| | | | | | | | | | | | | | | |
| | | | | | | | | | | | | | | |

OTHER REFERENCES (Including Author, Title, Date, Pertinent Pages, Etc.)

MUTSUHIRO MORI: "A 1500 V IGBT WITH A SELF-ALIGNED DMOS STRUCTURE FOR HIGH RESOLUTION CRT OPERATED UP TO 100 KHZ" 22 April 1991, PROCEEDINGS OF THE INTERNATIONAL SYMPOSIUM ON POWER SEMICONDUCTOR DEVICES AND IC'S, BALTIMORE, APRIL 22-24, 1991 NR. SYMP. 3, PAGE(S) 215-219, AYMAN SHIBIB; JAYANT BALIGA XP000220808 * page 215 *

Signed and Sealed this

Twenty-first Day of September, 1999

Attest:

Q. TODD DICKINSON

*Attesting Officer*        *Acting Commissioner of Patents and Trademarks*